United States Patent
Samir et al.

(10) Patent No.: US 11,515,179 B2
(45) Date of Patent: Nov. 29, 2022

(54) SEMICONDUCTOR PROCESSING CHAMBER MULTISTAGE MIXING APPARATUS

(71) Applicant: Applied Materials, Inc., Santa Clara, CA (US)

(72) Inventors: Mehmet Tugrul Samir, Mountain View, CA (US); Dongqing Yang, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/915,749

(22) Filed: Jun. 29, 2020

(65) Prior Publication Data

US 2020/0328098 A1  Oct. 15, 2020

Related U.S. Application Data

(63) Continuation of application No. 16/448,323, filed on Jun. 21, 2019, now Pat. No. 10,699,921, which is a
(Continued)

(51) Int. Cl.
  *H01L 21/311* (2006.01)
  *H01L 21/67* (2006.01)
  (Continued)

(52) U.S. Cl.
  CPC ...... *H01L 21/67069* (2013.01); *B01F 25/105* (2022.01); *H01L 21/31116* (2013.01); *B01F 2101/58* (2022.01)

(58) Field of Classification Search
  CPC ....... H01L 21/670699; H01L 21/02274; H01L 21/02326; H01L 21/32137;
  (Continued)

(56) References Cited

U.S. PATENT DOCUMENTS 6,464,795 B1 * 10/2002 Sherstinsky ...... C23C 16/45521
                                                    118/715
9,574,268 B1  2/2017 Dunn et al.
(Continued)

FOREIGN PATENT DOCUMENTS

JP         3021351 B2    3/2000
JP       2002-100624 A   4/2002
(Continued)

*Primary Examiner* — Brian Turner
(74) *Attorney, Agent, or Firm* — Kilpatrick Townsend & Stockton LLP

(57) ABSTRACT

Exemplary semiconductor processing systems may include a processing chamber, and may include a remote plasma unit coupled with the processing chamber. Exemplary systems may also include a mixing manifold coupled between the remote plasma unit and the processing chamber. The mixing manifold may be characterized by a first end and a second end opposite the first end, and may be coupled with the processing chamber at the second end. The mixing manifold may define a central channel through the mixing manifold, and may define a port along an exterior of the mixing manifold. The port may be fluidly coupled with a first trench defined within the first end of the mixing manifold. The first trench may be characterized by an inner radius at a first inner sidewall and an outer radius, and the first trench may provide fluid access to the central channel through the first inner sidewall.

20 Claims, 5 Drawing Sheets

Related U.S. Application Data continuation of application No. 15/897,860, filed on Feb. 15, 2018, now Pat. No. 10,679,870.

(51) Int. Cl.
  *C23C 16/455* (2006.01)
  *H01J 37/32* (2006.01)
  *C23C 16/44* (2006.01)
  *B01F 25/00* (2022.01)
  *B01F 101/58* (2022.01)

(58) Field of Classification Search
  CPC ............ H01L 21/31116; H01L 21/3065; H01J 37/32357; H01J 37/32862
  See application file for complete search history.

(56) References Cited

U.S. PATENT DOCUMENTS

| | | | |
|---|---|---|---|
| 10,679,870 B2 | 6/2020 | Samir et al. | |
| 10,699,921 B2 | 6/2020 | Samir et al. | |
| 2009/0056626 A1* | 3/2009 | Thakur | C23C 16/45582 118/699 |
| 2011/0223334 A1* | 9/2011 | Yudovsky | C23C 16/45504 427/255.23 |
| 2013/0284700 A1 | 10/2013 | Nangoy et al. | |
| 2015/0069723 A1* | 3/2015 | Wang | B23B 31/307 279/3 |
| 2016/0097119 A1* | 4/2016 | Cui | C23C 16/45563 134/1.1 |
| 2016/0168705 A1 | 6/2016 | Lind | |
| 2017/0030626 A1* | 2/2017 | Gloss | A01N 1/0252 |
| 2017/0335456 A1* | 11/2017 | Nguyen | C23C 16/45587 |
| 2017/0335457 A1* | 11/2017 | Nguyen | C23C 16/45512 |
| 2017/0350011 A1* | 12/2017 | Marquardt | H01L 21/28556 |
| 2018/0025900 A1 | 1/2018 | Park et al. | |
| 2019/0043726 A1 | 2/2019 | Yang et al. | |
| 2019/0067006 A1 | 2/2019 | Hawrylchak et al. | |

FOREIGN PATENT DOCUMENTS

| | | |
|---|---|---|
| JP | 2004-214622 A | 7/2004 |
| JP | 2011-526966 A | 10/2011 |
| JP | 2016-537824 A | 12/2016 |
| JP | 2019-004141 A | 1/2019 |
| JP | 2019-009423 A | 1/2019 |
| JP | 2019-530982 A | 10/2019 |
| JP | 2019-533910 A | 11/2019 |
| KR | 100208330 B1 | 7/1999 |
| KR | 101494469 B1 | 3/2015 |
| KR | 2018-0126391 A | 11/2018 |
| TW | 201805473 A | 2/2018 |
| TW | 2018-09341 A | 3/2018 |
| TW | 2019-07441 A1 | 2/2019 |

* cited by examiner

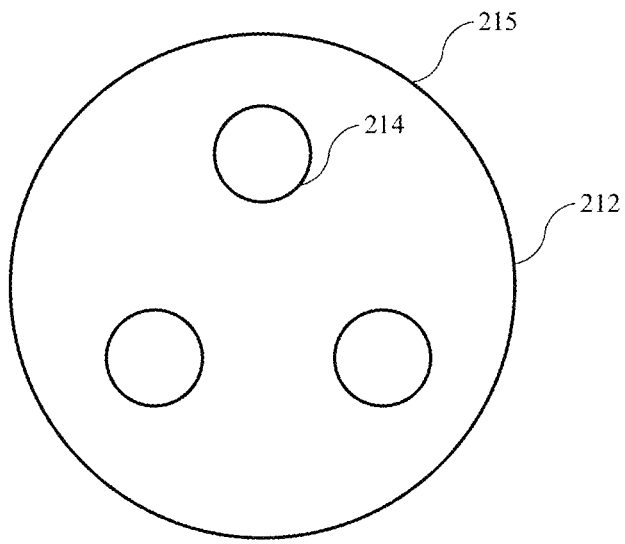
*FIG. 3*
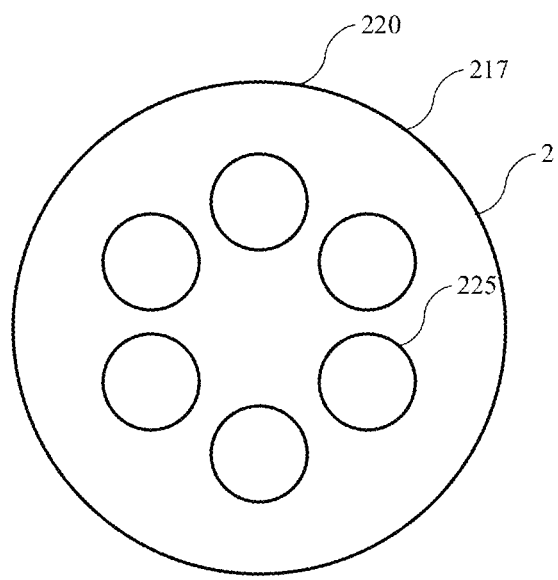 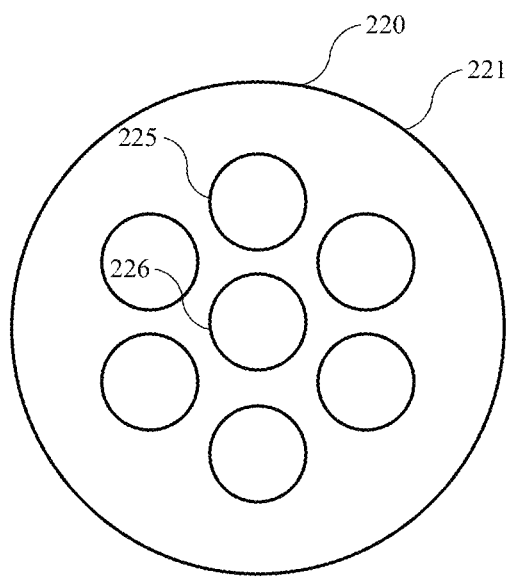
*FIG. 4*  *FIG. 5*

SEMICONDUCTOR PROCESSING CHAMBER MULTISTAGE MIXING APPARATUS

CROSS-REFERENCES TO RELATED APPLICATIONS

This application is a continuation of U.S. application Ser. No. 16/448,323, filed Jun. 21, 2019, which is a continuation of U.S. application Ser. No. 15/897,860, filed Feb. 15, 2018. The contents of both of these applications are hereby incorporated by reference in their entirety for all purposes.

TECHNICAL FIELD

The present technology relates to semiconductor systems, processes, and equipment. More specifically, the present technology relates to systems and methods for delivering precursors within a system and chamber.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, the ways in which systems deliver precursors into and through a chamber may have an increasing impact. As uniformity of processing conditions continues to increase in importance, chamber designs and system set-ups may have an important role in the quality of devices produced.

Thus, there is a need for improved systems and methods that can be used to produce high quality devices and structures. These and other needs are addressed by the present technology.

SUMMARY

Exemplary semiconductor processing systems may include a processing chamber, and may include a remote plasma unit coupled with the processing chamber. Exemplary systems may also include a mixing manifold coupled between the remote plasma unit and the processing chamber. The mixing manifold may be characterized by a first end and a second end opposite the first end, and may be coupled with the processing chamber at the second end. The mixing manifold may define a central channel through the mixing manifold, and may define a port along an exterior of the mixing manifold. The port may be fluidly coupled with a first trench defined within the first end of the mixing manifold. The first trench may be characterized by an inner radius at a first inner sidewall and an outer radius, and the first trench may provide fluid access to the central channel through the first inner sidewall.

In some embodiments, the mixing manifold may also include a second trench defined within the first end of the mixing manifold. The second trench may be located radially outward from the first trench, and the port may be fluidly coupled with the second trench. The second trench may be characterized by an inner radius at a second inner sidewall. The second inner sidewall may also define the outer radius of the first trench. The second inner sidewall may define a plurality of apertures defined through the second inner sidewall and providing fluid access to the first trench. The first inner sidewall may define a plurality of apertures defined through the first inner sidewall and providing fluid access to the central channel. Each aperture of the plurality of apertures defined through the second inner sidewall may be radially offset from each aperture of the plurality of apertures defined through the first inner sidewall.

The systems may also include an isolator coupled between the mixing manifold and the remote plasma unit. The isolator may be or include a ceramic. The systems may also include an adapter coupled between the mixing manifold and the remote plasma unit. The adapter may be characterized by a first end and a second end opposite the first end. The adapter may define a central channel extending partially through the adapter. The adapter may define a port through an exterior of the adapter. The port may be fluidly coupled with a mixing channel defined within the adapter. The mixing channel may be fluidly coupled with the central channel. The adapter may include an oxide on interior surfaces of the adapter. The systems may also include a spacer positioned between the adapter and the mixing manifold.

The present technology may also encompass semiconductor processing systems. The systems may include a remote plasma unit. The systems may include a processing chamber that may include a gasbox defining a central channel. The systems may include a blocker plate coupled with the gasbox. The blocker plate may define a plurality of apertures through the blocker plate. The systems may include a faceplate coupled with the blocker plate at a first surface of the faceplate. The systems may also include a mixing manifold coupled with the gasbox. The mixing manifold may be characterized by a first end and a second end opposite the first end. The mixing manifold may be coupled with the processing chamber at the second end. The mixing manifold may define a central channel through the mixing manifold that is fluidly coupled with the central channel defined through the gasbox. The mixing manifold may define a port along an exterior of the mixing manifold. The port may be fluidly coupled with a first trench defined within the first end of the mixing manifold. The first trench may be characterized by an inner radius at a first inner sidewall and an outer radius. The first trench may provide fluid access to the central channel through the first inner sidewall.

In some embodiments, the systems may also include a heater coupled externally to the gasbox about a mixing manifold coupled to the gasbox. The mixing manifold may be or include nickel. The systems may include an adapter coupled with the remote plasma unit. The adapter may be characterized by a first end and a second end opposite the first end. The adapter may define a central channel extending partially through the adapter from the first end to a midpoint of the adapter. The adapter may define a plurality of access channels from the midpoint of the adapter extending towards the second end of the adapter. The plurality of access channels may be distributed radially about a central axis through the adapter. The adapter may define a port through an exterior of the adapter. The port may be fluidly coupled with a mixing channel defined within the adapter. The mixing channel may extend through a central portion of the adapter towards the second end of the adapter. The adapter may define a port through an exterior of the adapter. The port may be fluidly coupled with a mixing channel defined within the adapter. The mixing channel may extend through a central portion of the adapter towards the midpoint of the adapter to fluidly access the central channel defined by the adapter.

The present technology may also encompass methods of delivering precursors through a semiconductor processing system. The methods may include forming a plasma of a fluorine-containing precursor in a remote plasma unit. The methods may include flowing plasma effluents of the fluorine-containing precursor into an adapter. The methods may include flowing a hydrogen-containing precursor into the adapter. The methods may include mixing the hydrogen-containing precursor with the plasma effluents to produce a first mixture. The methods may include flowing the first mixture to a mixing manifold. The methods may include flowing a third precursor into the mixing manifold. The methods may include mixing the third precursor with the first mixture to produce a second mixture. The methods may also include flowing the second mixture into a processing chamber.

Such technology may provide numerous benefits over conventional systems and techniques. For example, the present technology may utilize a limited number of components compared to conventional designs. Additionally, by utilizing components that produce etchant species outside of the chamber, mixing and delivery to a substrate may be provided more uniformly over traditional systems. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 3 shows a schematic partial bottom plan view of an isolator according to some embodiments of the present technology.

FIG. 4 shows a schematic partial top plan view of an adapter according to some embodiments of the present technology.

FIG. 5 shows a schematic cross-sectional view of an adapter through line A-A of FIG. 2 according to some embodiments of the present technology.

Figure 1:
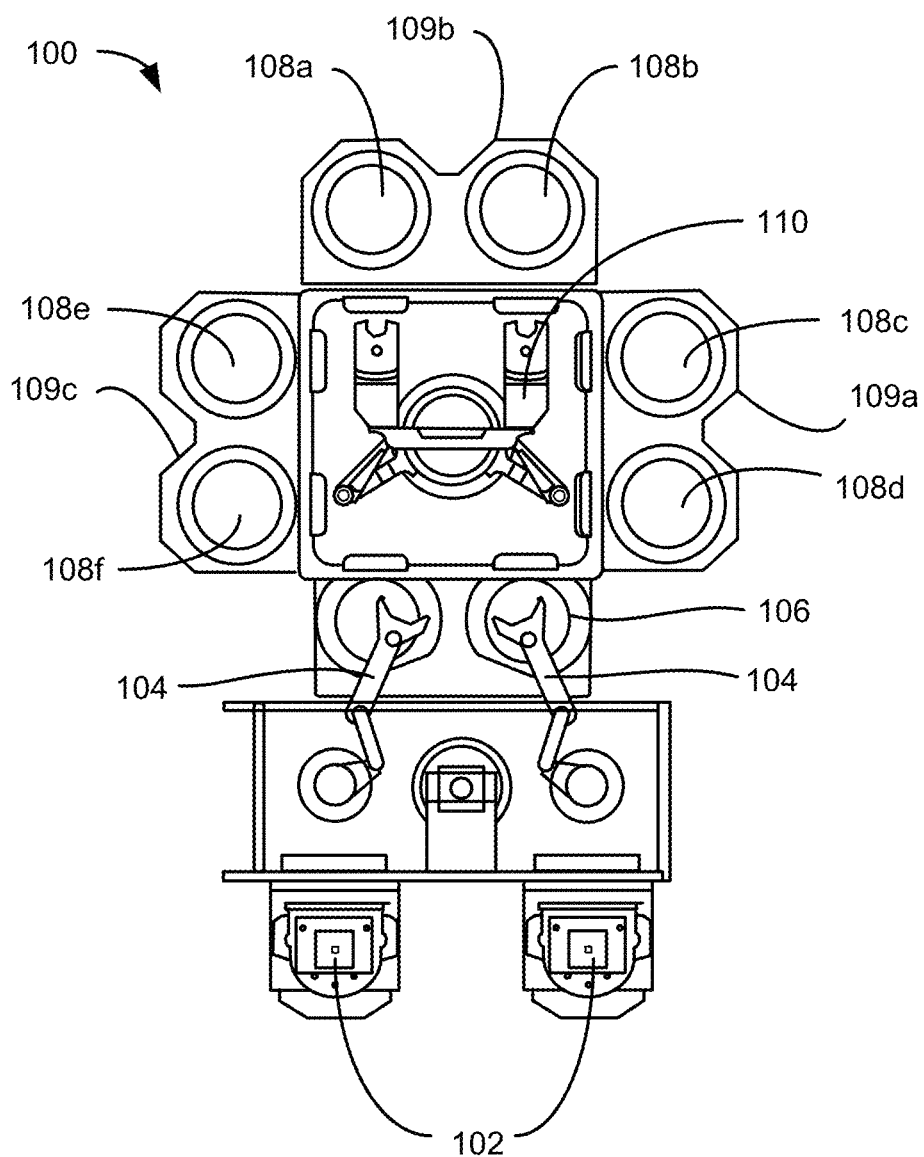
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems, chambers, and components for performing semiconductor fabrication operations. Many dry etch operations performed during semiconductor fabrication may involve multiple precursors. When energized and combined in various ways, these etchants may be delivered to a substrate to remove or modify aspects of a substrate. Traditional processing systems may provide precursors, such as for deposition or etching, in multiple ways. One way of providing enhanced precursors is to provide all of the precursors through a remote plasma unit before delivering the precursors through a processing chamber and to a substrate, such as a wafer, for processing. An issue with this process, however, is that the different precursors may be reactive with different materials, which may cause damage to the remote plasma unit or components delivering the precursors. For example, an enhanced fluorine-containing precursor may react with aluminum surfaces, but may not react with oxide surfaces. An enhanced hydrogen-containing precursor may not react with an aluminum surface within a remote plasma unit, but may react with and remove an oxide coating. Thus, if the two precursors are delivered through a remote plasma unit together, they may damage a coating or liner within the unit. Additionally, the power at which a plasma is ignited may affect the process being performed by the amount of dissociation produced. For example, in some processes a high amount of dissociation for a hydrogen-containing precursor may be beneficial, but a lower amount of dissociation for a fluorine-containing precursor may allow a more controlled etch.

Traditional processing may also deliver one precursor through a remote plasma device for plasma processing, and may deliver a second precursor directly into a chamber. An issue with this process, however, is that mixing of the precursors may be difficult, may not provide adequate control over etchant generation, and may not provide a uniform etchant at the wafer or substrate. This may cause processes to not be performed uniformly across a surface of a substrate, which may cause device issues as patterning and formation continues.

The present technology may overcome these issues by utilizing components and systems configured to mix the precursors prior to delivering them into the chamber, while only having one etchant precursor delivered through a remote plasma unit, although multiple precursors can also be flowed through a remote plasma unit, such as carrier gases or other etchant precursors. The particular bypass scheme may fully mix the precursors prior to delivering them to a processing chamber, and may provide intermediate mixing as each precursor is added to the system. This may allow uniform processes to be performed while protecting a remote plasma unit. Chambers of the present technology may also include component configurations that maximize thermal conductivity through the chamber, and increase ease of servicing by coupling the components in specific ways.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing component aspects and variations to this system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108*a-f*, positioned in tandem sections 109*a-c*. A Second Robotic Arm 110 May be Used to Transport the Substrate Wafers from the Holding Area 106 to the substrate processing chambers 108*a-f* and back. Each substrate processing chamber 108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108*a-f* may include one or more system components for depositing, annealing, curing and/or etching a dielectric film on the substrate wafer. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2:
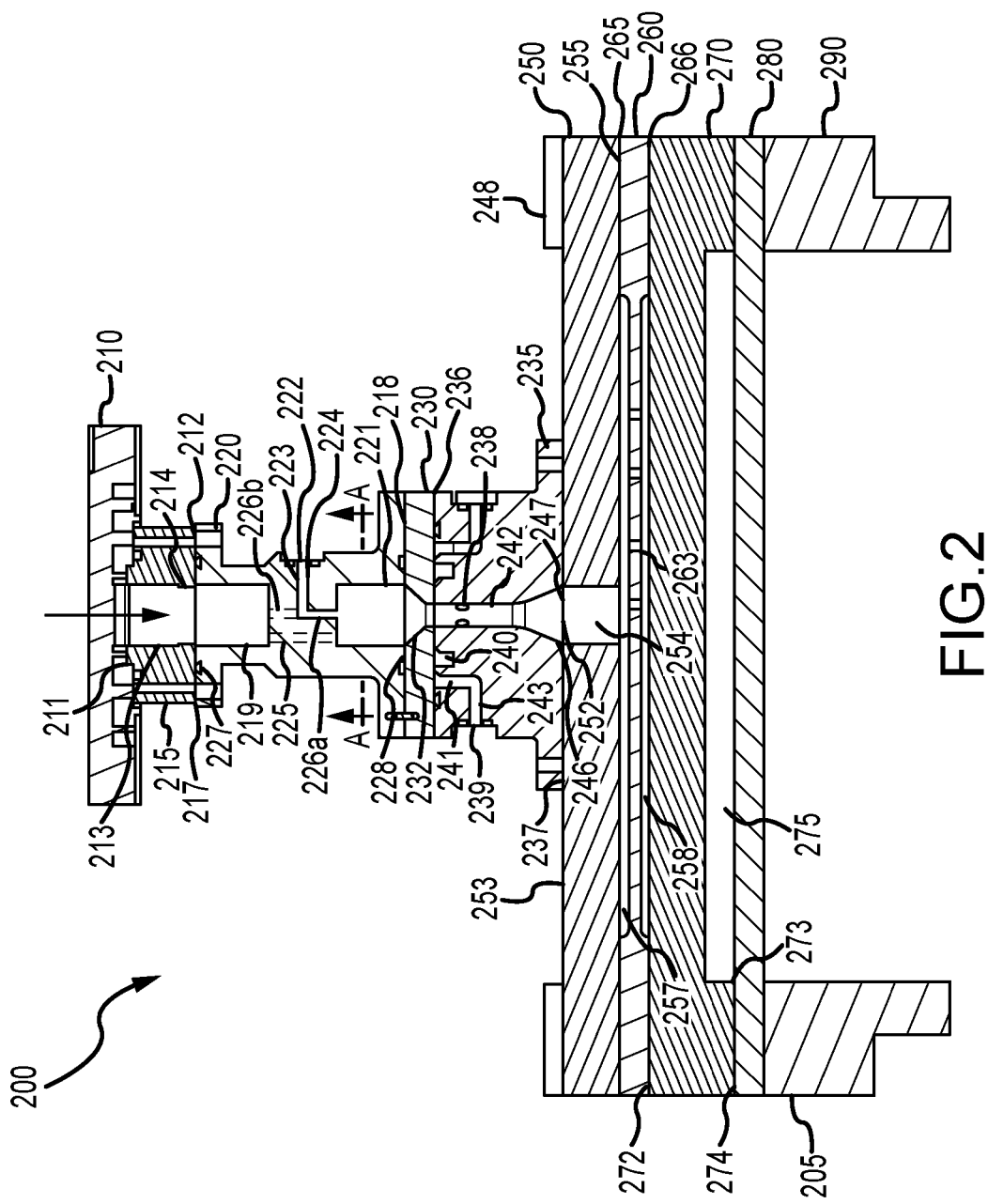
FIG. 2 shows a schematic cross-sectional view of an exemplary processing chamber according to some embodiments of the present technology.

FIG. 2 shows a schematic cross-sectional view of an exemplary processing system 200 according to embodiments of the present technology. System 200 may include a processing chamber 205 and a remote plasma unit 210. The remote plasma unit 210 may be coupled with processing chamber 205 with one or more components. The remote plasma unit 210 may be coupled with one or more of an isolator 215, an adapter 220, a spacer 230, and a mixing manifold 235. Mixing manifold 235 may be coupled with a top of processing chamber 205, and may be coupled with an inlet to processing chamber 205.

Isolator 215 may be coupled with remote plasma unit 210 at a first end 211, and may be coupled with adapter 220 at a second end 212 opposite first end 211. Through isolator 215 may be defined one or more channels. At first end 211 may be defined an opening or port to a channel 213. Channel 213 may be centrally defined within isolator 215, and may be characterized by a first cross-sectional surface area in a direction normal to a central axis through isolator 215, which may be in the direction of flow from the remote plasma unit 210. A diameter of channel 213 may be equal to or in common with an exit port from remote plasma unit 210. Channel 213 may be characterized by a length from the first end 211 to the second end 212. Channel 213 may extend through the entire length of isolator 215, or a length less than the length from first end 211 to second end 212. For example, channel 213 may extend less than half of the length from the first end 211 to the second end 212, channel 213 may extend halfway of the length from the first end 211 to the second end 212, channel 213 may extend more than half of the length from the first end 211 to the second end 212, or channel 213 may extend about half of the length from the first end 211 to the second end 212 of isolator 215.

Channel 213 may transition to smaller apertures 214 extending from a base of channel 213 defined within the isolator 215 through second end 212. For example, one such smaller aperture 214 is illustrated in FIG. 2, although it is to be understood that any number of apertures 214 may be defined from channel 213 to second end 212 through isolator 215. The smaller apertures may be distributed about a central axis of isolator 215 as will be discussed further below. Smaller apertures 214 may be characterized by a diameter less than or about 50% of a diameter of channel 213, and may be characterized by a diameter less than or about 40%, less than or about 30%, less than or about 20%, less than or about 10%, less than or about 5%, or less of the diameter of channel 213. Isolator 215 may also define one or more trenches defined beneath isolator 215. The trenches may be or include one or more annular recesses defined within isolator 215 to allow seating of an o-ring or elastomeric element, which may allow coupling with an adapter 220.

While other components of the processing system may be metal or thermally conductive materials, isolator 215 may be a less thermally conductive material. In some embodiments, isolator 215 may be or include a ceramic, plastic, or other thermally insulating component configured to provide a thermal break between the remote plasma unit 210 and the chamber 205. During operation, remote plasma unit 210 may be cooled or operate at a lower temperature relative to chamber 205, while chamber 205 may be heated or operate at a higher temperature relative to remote plasma unit 210. Providing a ceramic or thermally insulating isolator 215 may prevent or limit thermal, electrical, or other interference between the components.

Adapter 220 may be coupled with second end 212 of isolator 215 in embodiments. Adapter 220 may be characterized by a first end 217 and a second end 218 opposite the first end. Adapter 220 may define one or more central channels through portions of adapter 220. For example, from first end 217, central channel 219, or a first central channel, may extend at least partially through adapter 220 towards second end 218, and may extend through any length of adapter 220. Similar to central channel 213 of isolator 215, central channel 219 may extend less than half of a length through adapter 220, may extend about half of the length of adapter 220, or may extend more than half of the length of adapter 220. Central channel 219 may be characterized by a diameter, which may be related to, equal to, or substantially equal to a diameter of channel 213. Additionally, central channel 219 may be characterized by a diameter of a shape circumscribing apertures 214 of isolator 215 and in embodiments exactly circumscribing apertures 214, such as by being characterized by a radius substantially similar to or equivalent to a radius defined from a central axis through isolator 215 and extending to an outer edge of a diameter of each aperture 214. For example, central channel 219 may be characterized by a circular or ovular shape characterized by one or more diameters that may extend tangentially with an outer portion of each aperture 214.

Adapter 220 may define a base of central channel 219 within the adapter 220, which may define a transition from central channel 219 to a plurality of apertures 225 that may at least partially extend through adapter 220. The transition may occur at a midpoint through the adapter, which may be at any position along a length of the adapter. For example, apertures 225 may extend from a base of central channel 219 towards second end 218 of adapter 220, and may extend fully through second end 218. In other embodiments, apertures 225 may extend through a mid-portion of adapter 220 from a first end accessing central channel 219 to a second end accessing a second central channel 221, which may extend through second end 218 of adapter 220. Central channel 221 may be characterized by a diameter similar to central channel 219, and in other embodiments a diameter of central channel 221 may be greater than or less than a diameter of central channel 219. Apertures 225 may be characterized by a diameter less than or about 50% of a diameter of central channel 219, and may be characterized by a diameter less than or about 40%, less than or about 30%, less than or about 20%, less than or about 10%, less than or about 5%, or less of the diameter of central channel 219.

Adapter 220 may define a port 222 through an exterior of adapter 220, such as along a sidewall or side portion of adapter 220. Port 222 may provide access for delivering a first mixing precursor to be mixed with a precursor provided from remote plasma unit 210. Port 222 may provide fluid access to a mixing channel 223 that may at least partially extend through adapter 220 towards a central axis of adapter 220. Mixing channel 223 may extend at any angle into adapter 220, and in some embodiments a first portion 224 of mixing channel 223 may extend normal to a central axis through adapter 220 in a direction of flow, although first portion 224 may proceed at an angle of inclination or declination towards a central axis through adapter 220. First portion 224 may cross past apertures 225, which may be distributed about a central axis of adapter 220 similar to apertures 214 of isolator 215 described above. By this distribution, first portion 224 may extend past apertures 225 towards a central axis of adapter 220 without intersecting or crossing through apertures 225.

First portion 224 of mixing channel 223 may transition to a second portion 226 of mixing channel 223, which may travel vertically through adapter 220. In some embodiments, second portion 226 may extend along and be axially aligned with a central axis through adapter 220. Second portion 226 may also extend through a middle portion of a circle or other geometric shape extending through a central axis of each aperture 225. Second portion 226 may extend to and fluidly couple with second central channel 221 along with apertures 225. Accordingly, a precursor delivered through port 222 may be mixed with a precursor delivered through remote plasma unit 210 within a lower portion of adapter 220 in some embodiments. This may constitute a first stage of mixing within the components between the remote plasma unit 210 and the processing chamber 205.

Additionally illustrated in FIG. 2 is an alternative embodiment in which second portion 226 of mixing channel 223 extends vertically in the opposite direction. For example, as described above second portion 226a may extend vertically towards second central channel 221 to mix within this region. Alternatively, second portion 226b may extend vertically towards first central channel 219. Although illustrated in hidden view, second portion 226b is illustrated as a separate embodiment, and it is to be understood that adapters according to the present technology may include any version of second portion 226 extending towards first end 217 or second end 218 of adapter 220. When delivered in a direction towards first central channel 219, mixing of the second precursor delivered through port 222 may occur within a first portion of adapter 220, and may provide improved uniformity by causing the precursor delivered through port 222 to flow through the plurality of apertures 225 along with the precursor delivered from remote plasma unit 210. When delivered towards second central channel 221, it is possible that less complete mixing may occur due to the flow of precursors, which may increase a central concentration of the precursors delivered through central channel 221. When delivered towards first central channel 219, the precursor through port 222 may distribute radially within the first central channel and proceed more uniformly through apertures 225 as it is forced by the downward flow from the remote plasma unit 210 and/or pressure through the chamber.

Adapter 220 may be made of a similar or different material from isolator 215. In some embodiments, while isolator may include a ceramic or insulative material, adapter 220 may be made of or include aluminum, including oxides of aluminum, treated aluminum on one or more surfaces, or some other material. For example, interior surfaces of adapter 220 may be coated with one or more materials to protect adapter 220 from damage that may be caused by plasma effluents from remote plasma unit 210. Interior surfaces of adapter 220 may be anodized with a range of materials that may be inert to plasma effluents of fluorine, and which may include yttrium oxide or barium titanate, for example. Adapter 220 may also define trenches 227 and 228, which may be annular trenches, and may be configured to seat o-rings or other sealing elements.

Coupled with adapter 220 may be a spacer 230. Spacer 230 may be or include ceramic, and may be a similar material as either isolator 215 or adapter 220 in embodiments. Spacer 230 may define a central aperture 232 through spacer 230. Central aperture 232 may be characterized by a tapered shape through spacer 230 from a portion proximate second central channel 221 of adapter 220 to the opposite side of spacer 230. A portion of central aperture 232 proximate second central channel 221 may be characterized by a diameter equal to or similar to a diameter of second central channel 221. Central aperture 232 may be characterized by a percentage of taper of greater than or about 10% along a length of spacer 230, and may be characterized by a percentage of taper greater than or about 20%, greater than or about 30%, greater than or about 40%, greater than or about 50%, greater than or about 60%, greater than or about 70%, greater than or about 80%, greater than or about 90%, greater than or about 100%, greater than or about 150%, greater than or about 200%, greater than or about 300%, or greater in embodiments.

Mixing manifold 235 may be coupled with spacer 230 at a first end 236 or first surface, and may be coupled with chamber 205 at a second end 237 opposite first end 236. Mixing manifold 235 may define a central channel 238, which may extend from first end 236 to second end 237 and may be configured to deliver precursors into processing chamber 205. Mixing manifold 235 may also be configured to incorporate an additional precursor with the mixed precursors delivered from adapter 220. Mixing manifold may provide a second stage of mixing within the system. Mixing manifold 235 may define a port 239 along an exterior of mixing manifold 235, such as along a side or sidewall of mixing manifold 235. Mixing manifold 235 may define multiple ports 239 on opposite sides of mixing manifold 235 in some embodiments to provide additional access for delivery of precursors to the system. Mixing manifold 235 may also define one or more trenches within first surface 236 of mixing manifold 235. For example, mixing manifold 235 may define a first trench 240, and a second trench 241, which may provide fluid access from port 239 to central channel 238. For example, port 239 may provide access to a channel 243 that may provide fluid access to one or both trenches, such as from below a trench as illustrated. The trenches 240, 241 will be described in further detail below.

Central channel 238 may be characterized by a first portion 242 extending from first end 236 to a flared section 246. First portion 242 may be characterized by a cylindrical profile, and may be characterized by a diameter similar to or equal to an outlet of central aperture 232 of spacer 230. Flared section 246 may be characterized by a percentage of flare of greater than or about 10%, greater than or about 20%, greater than or about 30%, greater than or about 40%, greater than or about 50%, greater than or about 60%, greater than or about 70%, greater than or about 80%, greater than or about 90%, greater than or about 100%, greater than or about 150%, greater than or about 200%, greater than or about 300%, or greater in embodiments. Mixing manifold 235 may be made of a similar or different material than adapter 220 in embodiments. For example, mixing manifold 235 may include nickel, which may provide adequate protection against the precursors that may all contact portions of the mixing manifold. Unlike conventional technology, because the fluorine plasma effluents may already be mixed upstream of the mixing manifold, issues related to recombination may not occur. For example, without wishing to be bound by any particular theory, nickel may catalyze the recombination of fluorine radicals into diatomic fluorine, which may contribute to polysilicon loss in conventional technologies. When the fluorine effluents are mixed prior to delivery into a nickel, nickel plated, or coated component, this process may be limited as the concentration of fluorine effluents may be reduced, further protecting polysilicon features at the substrate level.

Flared section 246 may provide egress for precursors delivered through mixing manifold 235 through second end 237 via an outlet 247. The sections of central channel 238 through mixing manifold 235 may be configured to provide adequate or thorough mixing of precursors delivered to the mixing manifold, before providing the mixed precursors into chamber 205. Unlike conventional technology, by performing the etchant or precursor mixing prior to delivery to a chamber, the present systems may provide an etchant having uniform properties prior to being distributed about a chamber and substrate. Additionally, by providing multiple stages of mixing, more uniformity of mixing may be provided for each of the precursors. In this way, processes performed with the present technology may have more uniform results across a substrate surface. The illustrated stack of components may also limit particle accumulation by reducing the number of elastomeric seals included in the stack, which may degrade over time and produce particles that may affect processes being performed.

Chamber 205 may include a number of components in a stacked arrangement. The chamber stack may include a gasbox 250, a blocker plate 260, a faceplate 270, an optional ion suppression element 280, and a lid spacer 290. The components may be utilized to distribute a precursor or set of precursors through the chamber to provide a uniform delivery of etchants or other precursors to a substrate for processing. In embodiments, these components may be stacked plates each at least partially defining an exterior of chamber 205.

Gasbox 250 may define a chamber inlet 252. A central channel 254 may be defined through gasbox 250 to deliver precursors into chamber 205. Inlet 252 may be aligned with outlet 247 of mixing manifold 235. Inlet 252 and/or central channel 254 may be characterized by a similar diameter in embodiments. Central channel 254 may extend through gasbox 250 and be configured to deliver one or more precursors into a volume 257 defined from above by gasbox 250. Gasbox 250 may include a first surface 253, such as a top surface, and a second surface 255 opposite the first surface 253, such as a bottom surface of gasbox 250. Top surface 253 may be a planar or substantially planar surface in embodiments. Coupled with top surface 253 may be a heater 248.

Heater 248 may be configured to heat chamber 205 in embodiments, and may conductively heat each lid stack component. Heater 248 may be any kind of heater including a fluid heater, electrical heater, microwave heater, or other device configured to deliver heat conductively to chamber 205. In some embodiments, heater 248 may be or include an electrical heater formed in an annular pattern about first surface 253 of gasbox 250. The heater may be defined across the gasbox 250, and around mixing manifold 235. The heater may be a plate heater or resistive element heater that may be configured to provide up to, about, or greater than about 2,000 W of heat, and may be configured to provide greater than or about 2,500 W, greater than or about 3,000 W, greater than or about 3,500 W, greater than or about 4,000 W, greater than or about 4,500 W, greater than or about 5,000 W, or more.

Heater 248 may be configured to produce a variable chamber component temperature up to, about, or greater than about 50° C., and may be configured to produce a chamber component temperature greater than or about 75° C., greater than or about 100° C., greater than or about 150° C., greater than or about 200° C., greater than or about 250° C., greater than or about 300° C., or higher in embodiments. Heater 248 may be configured to raise individual components, such as the ion suppression element 280, to any of these temperatures to facilitate processing operations, such as an anneal. In some processing operations, a substrate may be raised toward the ion suppression element 280 for an annealing operation, and heater 248 may be adjusted to conductively raise the temperature of the heater to any particular temperature noted above, or within any range of temperatures within or between any of the stated temperatures.

Second surface 255 of gasbox 250 may be coupled with blocker plate 260. Blocker plate 260 may be characterized by a diameter equal to or similar to a diameter of gasbox 250. Blocker plate 260 may define a plurality of apertures 263 through blocker plate 260, only a sample of which are illustrated, which may allow distribution of precursors, such as etchants, from volume 257, and may begin distributing precursors through chamber 205 for a uniform delivery to a substrate. Although only a few apertures 263 are illustrated, it is to be understood that blocker plate 260 may have any number of apertures 263 defined through the structure. Blocker plate 260 may be characterized by a raised annular section 265 at an external diameter of the blocker plate 260, and a lowered annular section 266 at an external diameter of the blocker plate 260. Raised annular section 265 may provide structural rigidity for the blocker plate 260, and may define sides or an external diameter of volume 257 in embodiments. Blocker plate 260 may also define a bottom of volume 257 from below. Volume 257 may allow distribution of precursors from central channel 254 of gasbox 250 before passing through apertures 263 of blocker plate 260. Lowered annular section 266 may also provide structural rigidity for the blocker plate 260, and may define sides or an external diameter of a second volume 258 in embodiments. Blocker plate 260 may also define a top of volume 258 from above, while a bottom of volume 258 may be defined by faceplate 270 from below.

Faceplate 270 may include a first surface 272 and a second surface 274 opposite the first surface 272. Faceplate 270 may be coupled with blocker plate 260 at first surface 272, which may engage lowered annular section 266 of blocker plate 260. Faceplate 270 may define a ledge 273 at an interior of second surface 274, extending to third volume 275 at least partially defined within or by faceplate 270. For example, faceplate 270 may define sides or an external diameter of third volume 275 as well as a top of volume 275 from above, while ion suppression element 280 may define third volume 275 from below. Faceplate 270 may define a plurality of channels through the faceplate, although not illustrated in FIG. 2.

Ion suppression element 280 may be positioned proximate the second surface 274 of faceplate 270, and may be coupled with faceplate 270 at second surface 274. Ion suppression element 280 may be configured to reduce ionic migration into a processing region of chamber 205 housing a substrate. Ion suppression element 280 may define a plurality of apertures through the structure, although not illustrated in FIG. 2. In embodiments, gasbox 250, blocker plate 260, faceplate 270, and ion suppression element 280 may be coupled together, and in embodiments may be directly coupled together. By directly coupling the components, heat generated by heater 248 may be conducted through the components to maintain a particular chamber temperature that may be maintained with less variation between components. Ion suppression element 280 may also contact lid spacer 290, which together may at least partially define a plasma processing region in which a substrate is maintained during processing.

FIG. 3 shows a schematic partial bottom plan view of an isolator 215 according to some embodiments of the present technology. As discussed previously, isolator 215 may define a plurality of apertures 214 extending from central channel 213 to second end 212 of isolator 215. Apertures 214 may be distributed about a central axis through isolator 215, and may be distributed equidistantly from a central axis through isolator 215. Isolator 215 may define any number of apertures 214, which may increase movement, distribution, and/or turbulence of a precursor flowing through isolator 215.

FIG. 4 shows a schematic partial top plan view of an adapter 220 according to embodiments of the present technology. As previously described a first central channel 219 may extend from a first end 217 of adapter 220, and may extend partially through the adapter. The adapter may define a floor of the central channel, which may have a cylindrical profile, and may transition to a plurality of apertures 225 that extend through the adapter towards the second end as discussed above. Similar to apertures 214, apertures 225 may be distributed about a central axis through adapter 220, and may be positioned equidistantly about the central axis. Adapter 220 may define any number of apertures through the adapter, and in some embodiments may define more apertures than in isolator 215. The additional apertures may increase mixing with the added precursor. As previously noted, the mixing channel may deliver the additional precursor towards the first end of the adapter, and into first central channel 219. In this embodiment, the views of FIGS. 4 and 5 will be reversed.

FIG. 5 shows a schematic cross-sectional view of an adapter 220 through line A-A of FIG. 2 according to some embodiments of the present technology. FIG. 5 may illustrate a view through second central channel 221, which may show an outlet to the mixing channel through second portion 226 previously described. As illustrated, second portion 226 may extend between the apertures 225, and may extend along a central axis of adapter 220 towards the second end of the adapter. Additionally, as noted above, in embodiments where second portion 226 extends towards first central channel 219, the views of FIG. 4 and FIG. 5 would be reversed, and the mixed precursors from the remote plasma unit and the precursor introduced through the port in the adapter 220 would exit from apertures 225 pre-mixed.

Figure 6:
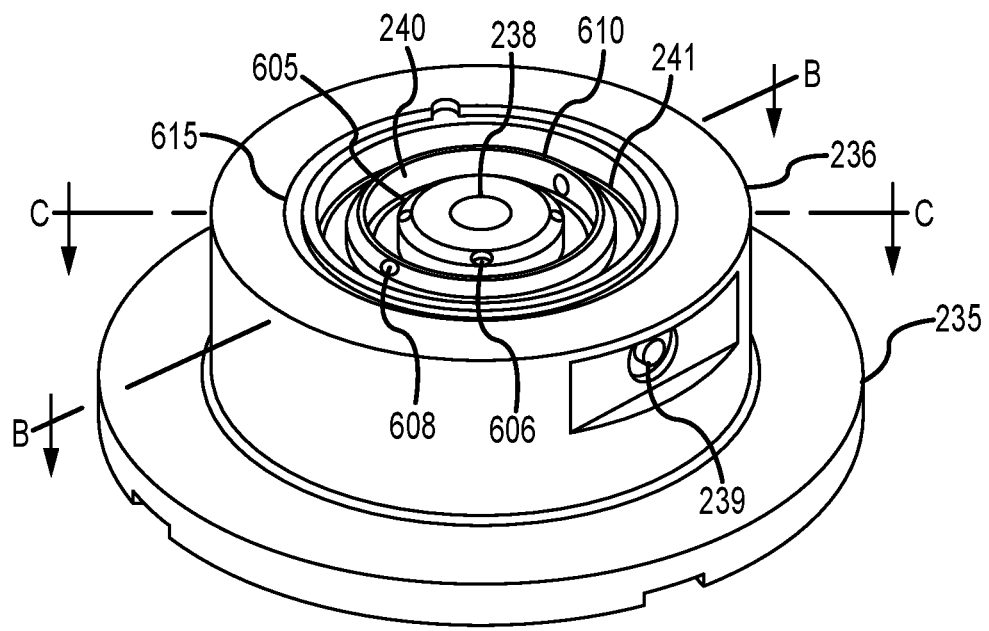
FIG. 6 shows a schematic perspective view of a mixing manifold according to some embodiments of the present technology.

FIG. 6 shows a schematic perspective view of mixing manifold 235 according to some embodiments of the present technology. As previously noted, mixing manifold 235 may define a central channel 238 through the mixing manifold, which may transport the mixed precursors from the adapter to the processing chamber. Mixing manifold 235 may also include a number of features allowing the introduction of an additional precursor that may be mixed with the previously mixed precursors. As previously described, one or more ports 239 may provide access for the introduction of a precursor into mixing manifold 235. Port 239 may access a channel as illustrated in FIG. 2, which may extend to one of more of the trenches defined in first surface 236 of mixing manifold 235.

Trenches may be defined in first surface 236 of mixing manifold 235, which may form channels that are at least partially isolated when mixing manifold is coupled with spacer 230 discussed previously. A first trench 240 may be formed about central channel 238. First trench 240 may be annular in shape, and may be characterized by an inner radius from a central axis through mixing manifold 235, and an outer radius. The inner radius may be defined by a first inner sidewall 605, which may define a top portion of the central channel 238 extending through the mixing manifold 235. The outer radius of first trench 240 may be defined by a first outer sidewall 610, which may be located radially outward from the first inner sidewall 605. The first trench 240 may provide fluid access to the central channel 238 through the first inner sidewall 605. For example, first inner sidewall 605 may define a number of apertures 606 through first inner sidewall 605. The apertures 606 may be distributed about first inner sidewall 605 to provide multiple access positions for the additional precursor to be delivered into the central channel 238.

First inner sidewall 605 may be characterized by a beveled or chamfered surface from the first surface 236 towards the first trench 240. In embodiments, a chamfered profile may be formed, which may maintain at least a portion of first inner sidewall 605 along first surface 236 available for coupling with spacer 230 discussed previously. The chamfer may also provide further lateral spacing to prevent leakage across the first surface between the first trench 240 and the central channel 238. Apertures 606 may be defined through the chamfered portion, and may be defined at an angle, such as at a right angle to a plane of the chamfered portion, or at some other angle through the first inner sidewall 605.

Mixing manifold 235 may define a second trench 241 that is formed radially outward from first trench 240. Second trench 241 may also be annular in shape, and central channel 238, first trench 240, and second trench 241 may be concentrically aligned about a central axis through the mixing manifold 235 in some embodiments. Second trench 241 may be fluidly coupled with the port 239 via channel 243 previously described. Channel 243 may extend to one or more positions within second trench 241 and may access second trench 241 from a base of the trench, although in other embodiments channel 243 may access trench 241 through a sidewall of the trench. By accessing from below the second trench 241, a depth of second trench 241 may be minimized, which may decrease the volume of the formed channel, and which may limit the diffusion of the precursor delivered to increase the uniformity of delivery.

Second trench 241 may be defined between first outer sidewall 610, which may alternatively be a second inner sidewall, and an outer radius defined by the body of the mixing manifold 235. In embodiments, first outer sidewall 610 may define each of the first trench 240 and the second trench 241 along the first surface 236 of the mixing manifold 235. First outer sidewall 610 may also be characterized by a beveled or chamfered profile along the first surface 236 on a side of the first outer sidewall proximate the second trench 241, similar to the profile of first inner sidewall 605. First outer sidewall 610 may also define a plurality of apertures 608 defined through the wall to provide fluid access between the second trench 241 and the first trench 240. The apertures 608 may be defined anywhere along or through first outer sidewall 610, and may be defined through the chamfered portion similar to the apertures through first inner sidewall 605. Accordingly, a precursor delivered through port 239 may flow into second trench 241, may pass through apertures 608 into first trench 240, and may pass through apertures 606 into central channel 238, where the precursor may be mixed with precursors delivered through adapter 220.

Apertures 608 may include any number of apertures defined through the first outer sidewall 610, and apertures 606 may include any number of apertures defined through the first inner sidewall 605. In some embodiments, the number of apertures through each wall may not be equal. For example, in some embodiments the number of apertures 606 through first inner sidewall 605 may be greater than the number of apertures 608 through the first outer sidewall, and in some embodiments, the number of apertures 606 may be double or more than the number of apertures 608. Additionally, apertures 608 may be radially offset from apertures 606, such that no aperture 608 is in line with any aperture 606 through a radius extending from a central axis of the mixing manifold 235. This aperture and channel design may provide for a recursive flow through the mixing manifold improving delivery of the additional precursor into the central channel 238, and may provide a more uniform delivery through each aperture 606. Mixing manifold 235 may also define an additional trench 615, which may be radially outward of second trench 241, and may be configured to receive an elastomeric element or o-ring.

Figure 7:
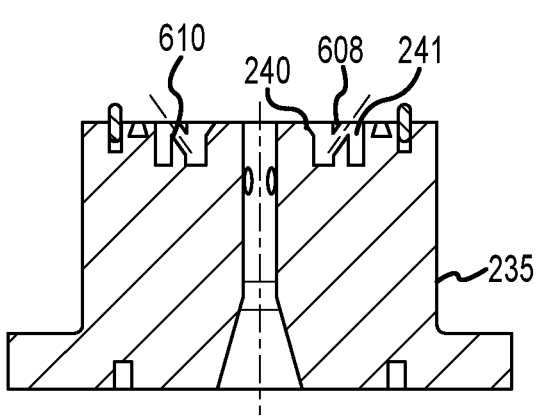
FIG. 7 shows a schematic cross-sectional view of a mixing manifold through line B-B of FIG. 6 according to some embodiments of the present technology.

FIG. 7 shows a schematic cross-sectional view of mixing manifold 235 through line B-B of FIG. 6 according to some embodiments of the present technology. The cross-section illustrates the apertures 608 as they are defined through first outer sidewall 610 to provide fluid access from second trench 241 to first trench 240. Additionally, FIG. 7 illustrates some embodiments in which apertures 608 are spaced a full diameter across from each other through the first outer sidewall. The apertures 608 are also spaced roughly so port 239 is spaced equidistantly between the two apertures 608. Channel 243 previously described may enter second trench 241 at a similar location to be an equal or substantially equal distance from each aperture 608.

Figure 8:
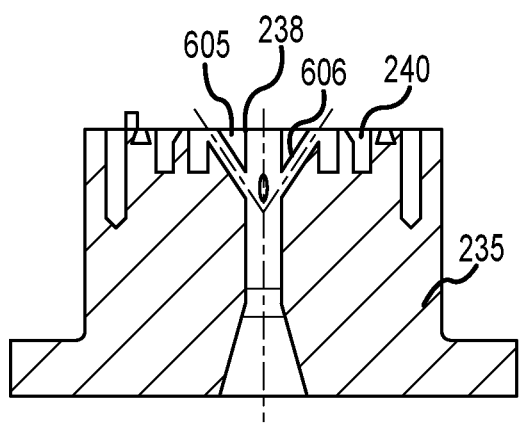
FIG. 8 shows a schematic cross-sectional view of a mixing manifold through line C-C of FIG. 6 according to some embodiments of the present technology.

FIG. 8 shows a schematic cross-sectional view of mixing manifold 235 through line C-C of FIG. 6 according to some embodiments of the present technology. The cross-section illustrates the apertures 606 as they are defined through first inner sidewall 605 to provide fluid access from first trench 240 to central channel 238. Apertures 606 as well as apertures 608 may extend through a chamfered portion of the first inner sidewall and first outer sidewall, respectively, and may extend at an angle normal to the angle of the chamfer, or at some other declining angle. By including a declining angle through the features, such as the first outer sidewall 610, the delivery may provide a flow that further distributes the precursor before the precursor rises to flow through the next set of apertures. This may also limit machining effects of forming the apertures, or otherwise damaging the first surface 236. Mixing manifold 235 may provide a design affording more uniform mixing of a precursor with one or more precursors extending through the central channel 238.

Figure 9:
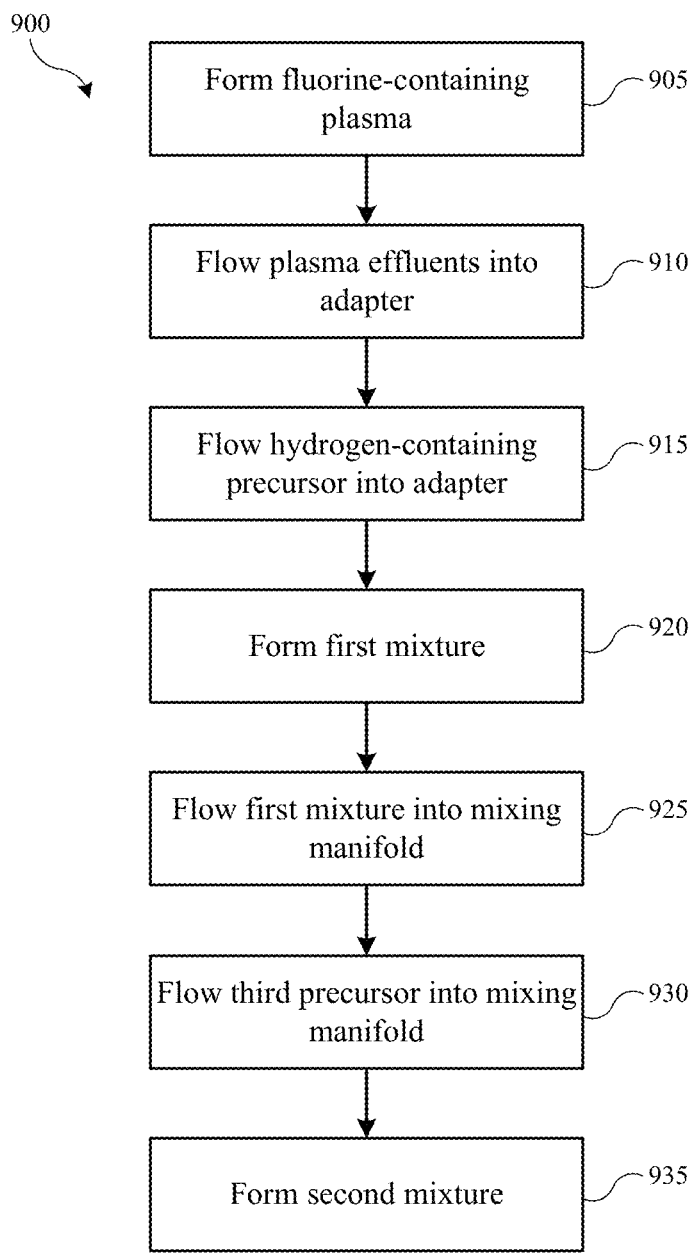
FIG. 9 shows operations of a method of delivering precursors through a processing system according to some embodiments of the present technology.

FIG. 9 shows operations of a method 900 of delivering precursors through a processing chamber according to some embodiments of the present technology. Method 900 may be performed in system 200, and may allow improved precursor mixing externally to the chamber, while protecting components from etchant damage. While components of a chamber may be exposed to etchants that may cause wear over time, the present technology may limit these components to those that may be more easily replaced and serviced. For example, the present technology may limit exposure of internal components of a remote plasma unit, which may allow particular protection to be applied to the remote plasma unit.

Method 900 may include forming a remote plasma of a fluorine-containing precursor in operation 905. The precursor may be delivered to a remote plasma unit to be dissociated to produce plasma effluents. In embodiments, the remote plasma unit may be coated or lined with an oxide or other material that may withstand contact with the fluorine-containing effluents. In embodiments, aside from carrier gases, no other etchant precursors may be delivered through the remote plasma unit, which may protect the unit from damage, and allow tuning of the plasma power to provide specific dissociation of the precursor as may be beneficial to particular processes being performed. Other embodiments configured to produce plasma effluents of a different etchant may be lined with a different material that may be inert to that precursor or a combination of precursors.

At operation 910, plasma effluents of the fluorine-containing precursor may be flowed into an adapter coupled with the remote plasma unit. At operation 915, a hydrogen-containing precursor may be flowed into the adapter. The adapter may be configured to provide mixing of the fluorine-containing precursor and the hydrogen-containing precursor within the adapter, to produce a first mixture at operation 920. At operation 925, the first mixture may be flowed from the adapter into a mixing manifold. At operation 930, a third precursor may be flowed into the mixing manifold. The third precursor may include an additional hydrogen-containing precursor, an additional halogen-containing precursor, or other combinations of precursors. The mixing manifold may be configured to perform a second stage of mixing of the third precursor with the first mixture, which may produce a second mixture 935.

Subsequently, the second mixture including all three precursors may be delivered from the mixing manifold into a semiconductor processing chamber. Additional components described elsewhere may be used to control delivery and distribution of the etchants as previously discussed. It is to be understood that the precursors identified are only examples of suitable precursors for use in the described chambers. The chambers and materials discussed throughout the disclosure may be used in any number of other processing operations that may benefit from separating precursors and mixing them prior to delivery into a processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system component comprising:
a mixing manifold comprising a body characterized by a first surface and a second surface opposite the first surface, the mixing manifold defining a central channel through the mixing manifold extending from the first surface through the second surface, wherein the central channel comprises an inlet end upstream of an outlet end, wherein the inlet end extends through the first surface and the outlet end extends through the second surface, wherein the mixing manifold defines a first trench defined within the first surface of the mixing manifold, wherein the first trench is characterized by an inner radius at a first inner sidewall and an outer radius, wherein the first inner sidewall defines a plurality of apertures through the first inner sidewall, and wherein the first trench provides fluid access to the central channel through the plurality of apertures defined in the first inner sidewall.

2. The semiconductor processing system component of claim 1, further comprising a port defined in the mixing manifold proximate the first surface, wherein the port is fluidly coupled with the first trench.

3. The semiconductor processing system component of claim 1, wherein the mixing manifold further comprises a second trench defined within the mixing manifold, wherein the second trench is located radially outward from the first trench.

4. The semiconductor processing system component of claim 3, wherein the second trench is characterized by an inner radius at a second inner sidewall, and wherein the second inner sidewall further defines the outer radius of the first trench.

5. The semiconductor processing system component of claim 4, wherein the second inner sidewall defines a plurality of apertures through the second inner sidewall and providing fluid access to the first trench.

6. The semiconductor processing system component of claim 5, wherein each aperture of the plurality of apertures defined through the second inner sidewall are radially offset from each aperture of the plurality of apertures defined through the first inner sidewall.

7. The semiconductor processing system component of claim 5, wherein two apertures are defined through the second inner sidewall at opposite ends of a diameter through the second inner sidewall.

8. The semiconductor processing system component of claim 7, wherein a port is defined by the mixing manifold equidistantly between the two apertures defined through the second inner sidewall.

9. The semiconductor processing system component of claim 1, wherein at least three apertures are defined in the first inner sidewall, and wherein the apertures are distributed equidistantly about the first inner sidewall.

10. The semiconductor processing system component of claim 1, wherein the first inner sidewall is characterized by a chamfered edge.

11. The semiconductor processing system component of claim 10, wherein the plurality of apertures defined in the first inner sidewall are defined through the chamfered edge of the first inner sidewall.

12. The semiconductor processing system component of claim 11, wherein the plurality of apertures are defined at an angle through the first inner sidewall.

13. The semiconductor processing system component of claim 1, wherein the mixing manifold comprises nickel.

14. The semiconductor processing system component of claim 13, wherein the nickel is nickel plating.

15. A semiconductor processing system component comprising:
   a mixing manifold comprising a body characterized by a first surface and a second surface opposite the first surface, the mixing manifold defining a central channel through the mixing manifold extending from the first surface through the second surface, wherein the central channel comprises an inlet end upstream of an outlet end, wherein the inlet end extends through the first surface and the outlet end extends through the second surface, wherein the mixing manifold defines a port along an exterior wall of the mixing manifold between the first surface and the second surface, wherein the port is fluidly coupled with a first trench defined within the first surface of the mixing manifold, wherein the first trench is characterized by an inner radius at a first inner sidewall and an outer radius, wherein the first trench provides fluid access to the central channel through the first inner sidewall, wherein the mixing manifold further defines a second trench, wherein the second trench is located radially outward from the first trench, and wherein the port is fluidly coupled with the second trench.

16. The semiconductor processing system component of claim 15, wherein the second trench is characterized by an inner radius at a second inner sidewall, and wherein the second inner sidewall further defines the outer radius of the first trench.

17. The semiconductor processing system component of claim 16, wherein the second inner sidewall defines a plurality of apertures defined through the second inner sidewall and providing fluid access to the first trench.

18. The semiconductor processing system component of claim 17, wherein the second inner sidewall defines two apertures through the second inner sidewall, and wherein the first inner sidewall defines a plurality of apertures defined through the first inner sidewall, and wherein each aperture defined through the second inner sidewall is radially offset from each aperture of the plurality of apertures defined through the first inner sidewall.

19. A semiconductor processing system component comprising:
   a mixing manifold comprising a body characterized by a first surface and a second surface opposite the first surface, the mixing manifold defining a central channel through the mixing manifold extending from the first surface to the second surface, wherein the central channel comprises an inlet end upstream of an outlet end, wherein the inlet end extends through the first surface and the outlet end extends through the second surface, wherein the mixing manifold defines a port along a sidewall of the mixing manifold extending between the first surface and the second surface, wherein the port is fluidly coupled with a first trench defined within the first surface of the mixing manifold, wherein the first trench is characterized by an inner radius at a first inner sidewall and an outer radius, wherein the first trench provides fluid access to the central channel through the first inner sidewall, wherein the first inner sidewall defines at least three apertures through the first inner sidewall, and wherein the apertures are distributed equidistantly about the first inner sidewall.

20. The semiconductor processing system component of claim 19, wherein the mixing manifold further comprises a second trench defined within the mixing manifold, wherein the second trench is located radially outward from the first trench.

* * * * *